United States Patent [19]

Inoue et al.

[11] 4,223,284
[45] Sep. 16, 1980

[54] ACOUSTIC SURFACE WAVE DEVICE

[75] Inventors: Atsushi Inoue; Hiromichi Yamada; Kenji Suzuki, all of Nagaokakyo, Japan

[73] Assignee: Murata Manufacturing Co., Ltd., Kyoto, Japan

[21] Appl. No.: 955,638

[22] Filed: Oct. 30, 1978

[30] Foreign Application Priority Data

Nov. 7, 1977 [JP] Japan .......................... 52-149763[U]
Nov. 7, 1977 [JP] Japan .......................... 52-149764[U]
Nov. 7, 1977 [JP] Japan .......................... 52-149765[U]

[51] Int. Cl.$^2$ .................... H03H 9/26; H03H 9/30; H03H 9/04; H01L 41/10
[52] U.S. Cl. ........................... 333/150; 310/313 B; 333/154; 333/196
[58] Field of Search ................. 333/150–155, 333/193–196; 310/313; 331/107 A; 29/25.35

[56] References Cited

U.S. PATENT DOCUMENTS

| 3,675,054 | 7/1972 | Jones et al. ........................ 333/150 |
| 4,143,343 | 3/1979 | Inoue et al. ........................ 333/151 |

FOREIGN PATENT DOCUMENTS 1362238 7/1974 United Kingdom.

Primary Examiner—Marvin L. Nussbaum
Attorney, Agent, or Firm—Birch, Stewart, Kolasch & Birch

[57] ABSTRACT

An acoustic surface wave device comprises a transducer including an interdigital electrode formed on the surface of a piezoelectric material substrate and cooperative with the same for converting an electrical signal into an acoustic surface wave and vice versa. The interdigital electrode comprises at least two divided comb shaped electrodes divided in the propagating direction of the acoustic surface wave and a common comb shaped electrode commonly coupled in an interdigital manner to the two divided comb shaped electrodes. Thus, the above described two comb shaped electrodes are disposed such that both divided electrodes arranged in succession in the propagating direction of the acoustic surface wave while the fingers of both divided electrodes extend in the same direction and the common comb shaped electrode is disposed such that the fingers of the common comb shaped electrode are interdigitated with the fingers of both divided comb shaped electrodes. The electrode finger of each of both comb shaped electrodes at the end adjacent to the opposite divided comb shaped electrode comes close to each other at a dividing region without interposition of any finger of the common comb shaped electrode. Both divided comb shaped electrodes are connected to different potentials, respectively. The length of the electrode finger of each of the divided comb shaped electrodes adjacent to each other at the dividing region is selected to be shorter than the overlapping lengths of the adjacent electrode fingers that are overlapped with each other, whereby discontinuity of the surface wave energy in the dividing region is eliminated or mitigated.

10 Claims, 14 Drawing Figures

ACOUSTIC SURFACE WAVE DEVICE

BACKGROUND OF THE INVENTION

1. Field of the Invention:

The present invention relates to an acoustic surface wave device. More specifically, the present invention relates to an improvement in an acoustic surface wave device including a combination of a piezoelectric material substrate and an interdigital electrode formed thereon wherein the interdigital electrode is divided in the progagating direction of the acoustic surface wave into a plurality of electrode portions and these electrode portions are electrically connected in a series fashion.

2. Description of the Prior Art

As well known, the impedance of an acoustic surface wave device is determined by an electrostatic capacitance formed by an interdigital electrode and a piezoelectric material substrate and the electrostatic capacitance is further determined as a function of a capacitance value between the paired adjacent electrode fingers that are overlapped with each other in the interdigital manner and the number of such pairs. Accordingly, it would be appreciated that the impedance of the acoustic surface wave device is determinable depending on the number of pairs of the adjacent electrode fingers that are overlapped with each other in the interdigital manner. On the other hand, in actual application of an acoustic surface wave device, the impedance of the device must be matched with the impedance of another circuit to which the device is coupled. Of late, therefore, for the purpose of facilitating the impedance matching of an acoustic surface wave device with another circuit to which the device is coupled by reducing an electrostatic capacitance thereby to increase the impedance, the interdigital electrode is divided in the propagating direction of the acoustic surface wave into a plurality of electrode portions and the divided electrode portions are electrically connected in a series fashion. Such type of acoustic surface wave device is often referred to as a divided type acoustic surface wave device. An acoustic surface wave device comprising a divided interdigital electrode structure is disclosed for example in U.S. Pat. No. 3,600,710, issued Aug. 17, 1971 to Robert Adler and entitled "ACOUSTIC SURFACE WAVE FILTER"; and U.S. Pat. No. 3,675,054, issued July 4, 1972 to William Stanley Jones and entitled "SERIES CONNECTION OF INTERDIGITATED SURFACE WAVE TRANSDUCERS".

FIGS. 1 to 3 show several examples of elecrodes patterns of the conventional divided type acoustic surface wave devices. Referring to FIG. 1, the device shown comprises a transducer 100 including an interdigital electrode including two divided electrode portions 10 and 20. The divided electrode portion 10 comprises comb shaped electrodes 1 and 3 which are interdigitated with each other. Similarly, the divided electrode portion 20 comprises comb shaped electrodes 2 and 3 which are interdigitated with each other. The comb shaped electrode 3 in the divided electrode portion 10 is connected to the comb shaped electrode 3 in the divided electrode portion 20 through a connecting finger 4. If and when the comb shaped electrodes 1 and 2 are connected to different potentials, the comb shaped electrode 3 is placed in an intermediate potential of those of the comb shaped electrodes 1 and 2, i.e. a common potential with respect to the two divided electrode portions 10 and 20. The width of the electrode fingers of the respective comb shaped electrodes 1, 2 and 3 is selected to be $\frac{1}{4}\lambda$, while the spacing between the adjacent electrode fingers is also selected to be $\frac{1}{4}\lambda$, where $\lambda$ is the wave length of the acoustic surface wave propagating along the piezoelectric material substrate.

The electrode patterns of the acoustic surface wave devices shown in FIGS. 2 and 3 are different from that of the device shown in FIG. 1 in the manner of connection of two divided electrode portions 10 and 20. More specifically, the FIG. 1 device comprises the connecting electrode finger 4 in the dividing region which has the width of $\frac{3}{4}\lambda$, whereby the interdigital electrodes of the two divided electrode portions 10 and 20 are electrically connected in a series fashion. On the other hand, the FIG. 2 device comprises two adjoining electrode fingers 5 and 6 which are placed in the common potential through connection to the common comb shaped electrode 3. The FIG. 3 device comprises in the dividing region an electrode finger 7 placed in the same potential as that of the comb shaped electrode 1 and an electrode finger 8 placed in the same potential as that of the comb shaped electrode 2 which are disposed to be adjacent to each other so as to be overlapped with each other.

FIGS. 4 and 5 show other examples of electrode patterns of the interdigital electrodes of the further conventional acoustic surface wave devices. FIGS. 4 and 5 are similar to FIGS. 2 and 3, respectively, but are different from FIGS. 2 and 3 in that each electrode finger of the devices shown in FIGS. 4 and 5 is formed in a split type although each finger of the devices shown in FIGS. 2 and 3 is a solid type. A split type electrode of the interdigital electrodes for an acoustic surface wave device is disclosed in U.S. Pat. No. 3,727,155 issued Apr. 10, 1973 to Adrian J. DeVries and entitled "ACOUSTIC SURFACE WAVE FILTER".

By dividing one interdigital transducer into a plurality of divided electrode portions and by connecting the divided electrode portions in a series fashion, an electrostatic capacitance of the acoustic surface wave device can be decreased, whereby the impedance of the device can be increased. Nevertheless, it has been observed that the following problems are encountered by the conventional approach of electrode division as shown in FIGS. 1 to 5. More specifically, the FIG. 1 device comprises a connecting electrode finger 4 of an increased width for connecting two divided electrode portions 10 and 20. Therefore, the impedance at the electrode finger 4 causes a phase difference in the signal to be applied to the divided electrode portions 10 and 20 and thus a phase difference in the acoustic surface wave energy excited by the respective divided electrode portions 10 and 20. In addition, the acoustic surface wave is not excited within the region of the connecting electrode finger 4 per se, which causes discontinuity of the intensity of the acoustic surface wave energy between the two divided electrode portions 10 and 20.

The acoustic surface wave devices shown in FIGS. 2 and 4 both comprise in the dividing region, electrode fingers 5 and 6 which are placed in the intermediate potential and thus in the same potential. Accordingly, the voltage applied between adjacent electrode fingers 5 and 6 is zero, with the result that the acoustic surface wave is not excited in the region between the divided electrode portions 10 and 20. Therefore, again the intensity of the acoustic surface wave energy is discontinuous at the region between the electrode fingers 5 and 6.

In case of the acoustic surface wave devices shown in FIGS. 3 and 5, the voltage developed between the two adjacent electrode fingers 7 and 8 is as large as two times the voltage developed between any other two adjacent electrode fingers and thus the intensity of the acoustic surface wave energy excited between the electrode fingers 7 and 8 is also as large as two times the energy intensity excited between any other two adjacent electrode fingers, with the result that the acoustic surface energy intensity is discontinuous in the dividing region between the electrode fingers 7 and 8.

The U.S. Pat. No. 3,699,364 issued Oct. 17, 1972 to Henry M. Gerard and entitled "ACOUSTIC SURFACE WAVE DEVICE HAVING IMPROVED TRANSDUCER STRUCTURE" discloses an acoustic surface wave device wherein a desired frequency characteristic is attained by changing the overlapping lengthes of the adjacent electrode fingers that are overlapped with each other in accordance with a weighting function determined by an impulse response obtained by inverse Fourier transformation of the above described frequency characteristic. Such weighted electrode pattern of the electrode fingers is advantageously utilized in an increased attenuation of the side lobe of the frequency characteristic, a non-symmetrical frequency characteristic with given frequency positions attenuated and the like. Nevertheless, the weighted electrode pattern of the electrode fingers increases discontinuity of the acoustic surface wave energy intensity at the dividing region as compared with the ordinary electrode pattern of the electrode fingers, if the electrode division is employed in such weighted electrode pattern type acoustic surface wave device.

The above discussed discontinuity of the acoustic surface wave energy intensity reduces the freedom in designing of a transducer for an acoustic surface wave device. More specifically, the above described discontinuity of the acoustic surface wave energy intensity makes impossible designing of an acoustic surface wave device having some type of frequency characteristic. The present invention is directed to an improvement in an acoustic surface wave device as shown in FIGS. 3 and 5 having two adjacent electrode fingers at the ends close to each other of the divided comb shaped electrodes, wherein the freedom of designing of the device is increased.

SUMMARY OF THE INVENTION

According to the present invention, an interdigital electrode is divided in the propagating direction of the acoustic surface wave energy into at least two divided electrode portions and the divided electrode portions are electrically connected in a series fashion. More specifically, one comb shaped electrode of a first divided electrode portion is connected to a first potential, the other comb shaped electrode of the first divided electrode portion is connected to one divided comb shaped electrode of a second divided electrode portion. The other comb shaped electrode of the second divided electrode portion is connected to a second potential. Thus, the other comb shaped electrode of the first divided electrode portion and one comb shaped electrode of the second divided electrode portions are commonly connected and placed in an intermediate common potential. The interdigital electrode is divided in such a manner that the electrode fingers of one comb shaped electrode in the first divided electrode portion and the other comb shaped electrode of the second divided electrode portion are directly adjacent to each other and are overlapped with each other at the ends close to each other. According to the present invention, the above described adjacent electrode fingers of the comb shaped electrodes that are of different potentials are made shorter in the length than the original lengths of these adjacent electrode fingers that are defined by the envelope of the free ends of the adjacent electrode fingers. As a result, the dicontinuity of the acoustic surface wave energy intensity in the dividing region between the divided electrode portions is eliminated or mitigated.

Therefore, a principal object of the present invention is to eliminate or mitigate the discontinuity of the acoustic surface wave energy intensity excited at the dividing region in a divided electrode type acoustic surface wave device wherein the interdigital electrode is divided in the propagating direction of the acoustic surface wave into a plurality of divided electrode portions and the divided electrode portions are connected in a series fashion such that the electrode fingers of different potentials are adjacent to each other at the dividing region.

Another object of the present invention is to shorten the lengths of the adjacent electrode fingers of different potentials in the dividing region in an electrode divided type acoustic surface wave device for eliminating the discontinuity of the acoustic surface wave energy intensity in the dividing region.

The present invention can be equally applicable to both of an acoustic surface wave device employing an interdigital electrode of the electrode fingers of a solid type and an acoustic surface wave device having an interdigital electrode of the electrode fingers of a split type. The present invention is also applicable to an acoustic surface wave device having an interdigital electrode wherein the overlapping lengths of the adjacent electrode fingers that are overlapped with each other has been changed in accordance with a weighting function determined by a desired frequency characteristic.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
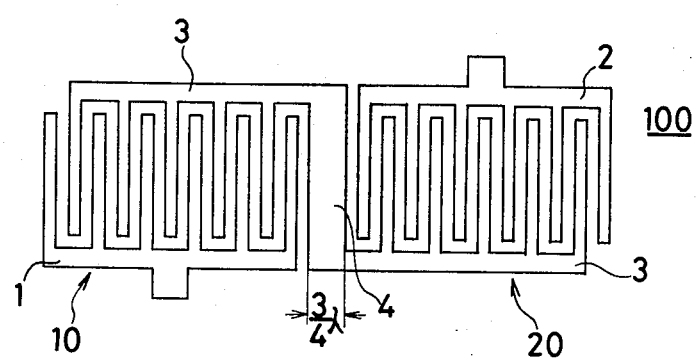
FIGS. 1 to 5 show electrode patterns of interdigital electrodes employed in various conventional acoustic surface wave devices having an interdigital electrode.
Figure 2:
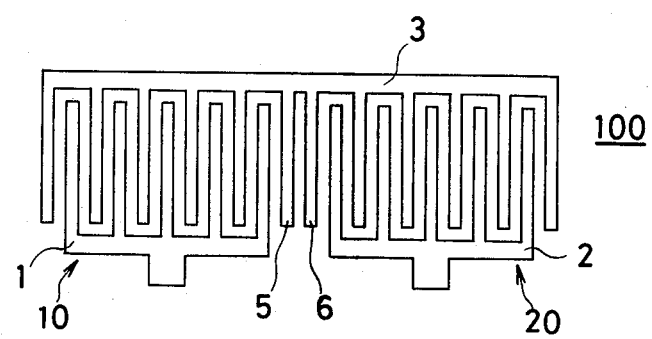
Figure 3:
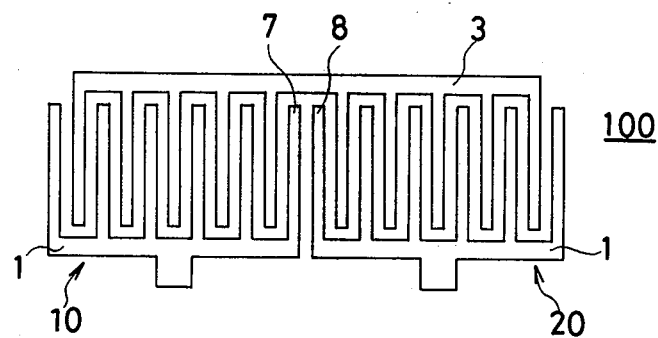
Figure 4:
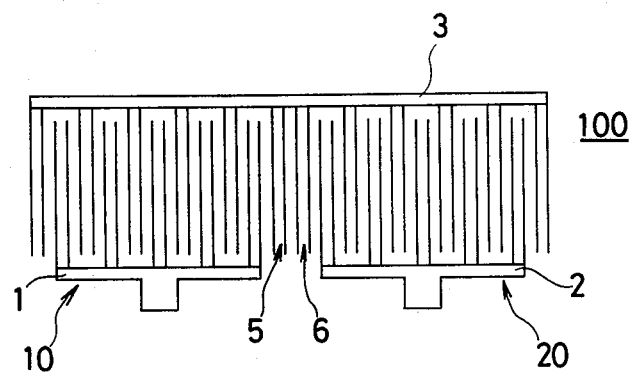
Figure 5:
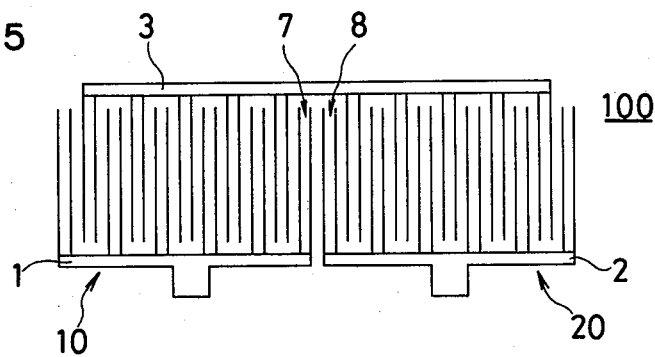
Figure 6A:
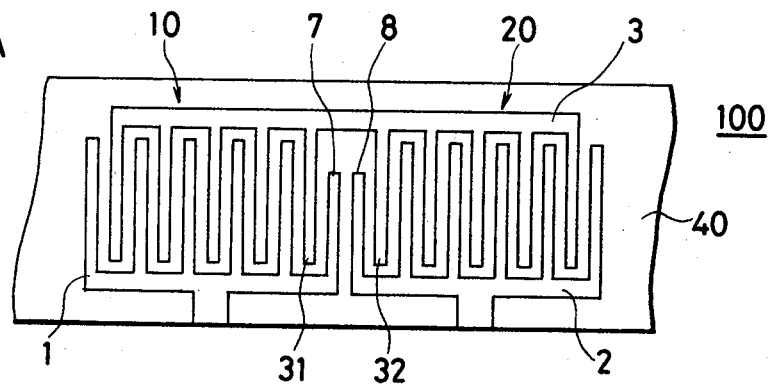
FIG. 6A shows an electrode pattern of the interdigital electrode of one embodiment of the present invention.

FIG. 6A shows an electrode pattern of an interdigital electrode of one embodiment of the present invention. The FIG. 6A embodiment comprises an improvement in the FIG. 3 acoustic surface wave device and includes a transducer 100 employing an interdigital electrode of an ordinary type electrode pattern. The transducer 100 comprises a piezoelectric material substrate 40 for deposition of the interdigital electrode thereon. The piezoelectric material substrate 40 may be a plate of piezoelectric ceramic such as PZT, a single crystal of such as $LiNbO_3$, or a piezoelectric film such as ZnO. The interdigital electrode is formed on the surface of the piezoelectric material substrate 40 and comprises two divided electrode portions 10 and 20. The divided electrode portion 10 comprises comb shaped electrodes 1 and 3, while the divided electrode portion 20 comprises comb shaped electrodes 2 and 3. Since the respective embodiments of the present invention such as shown in FIG. 6A and the other figures comprise improvements in the conventional devices such as shown in FIGS. 1 to 5, like portions have been denoted by the same reference characters and a detailed description will be omitted, insofar as the same is unnecessary.

Figure 6B:
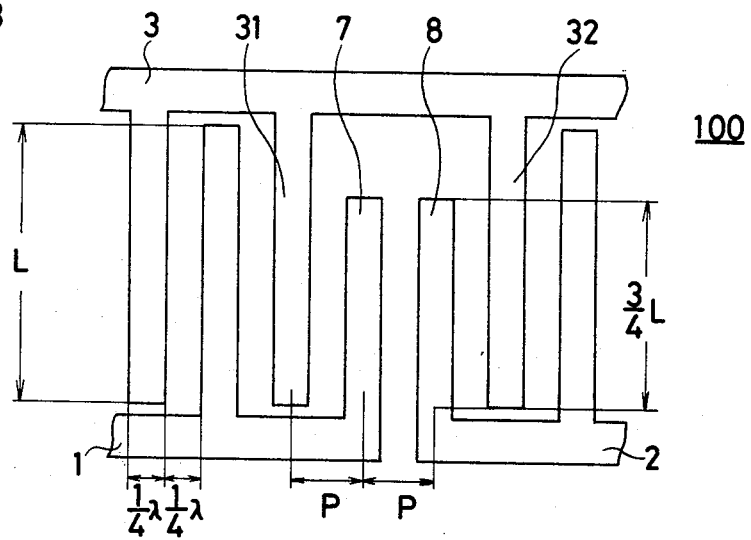
FIG. 6B shows an enlarged view of the electrode pattern at the dividing region of the FIG. 6A embodiment.

In the embodiment shown in FIG. 6A, the two adjacent electrode fingers 7 and 8 of the comb shaped electrodes 1 and 2 at the ends thereof adjacent to each other at the dividing region are made shorter in length than the lengths of the remaining electrode fingers, i.e. the overlapping lengths of any other adjacent electrode fingers. The electrode pattern of the FIG. 6A embodiment at the dividing region is shown in FIG. 6B in an enlarged manner. As best seen in FIG. 6B, the adjacent electrode fingers 7 and 8 adjacent to each other at the dividing region are selected to be as short as three fourth (¾) of the overlapping lengths of any other adjacent electrode fingers. It is pointed out that the above described shortened lengths of the adjacent electrode fingers 7 and 8 may be a little longer or shorter than the above described shortened lengths, which is determined in the light of the overall configuration of the electrode pattern. For example, the width of the portion for commonly connecting the finger portions should be preferably taken into consideration, inasmuch as the width of such common connecting portion might have some influence upon the electric characteristic determined by the overlapping lengths of the adjacent electrode fingers 7 and 8. If and when the acoustic surface wave device is of a weighted overlapping type, the weighting function should also be taken into consideration. In the embodiment shown in FIG. 6B, both the width of the electrode fingers and the spacing between the adjacent electrode fingers are selected to be ¼λ, where λ is the wave length of the acoustic surface wave in terms of the central frequency of the filter when the transducer 100 is formed as a filter. It is also pointed out that the embodiment shown employs the electrode fingers of a solid type.

Now description will be made of how the discontinuity of the acoustic surface wave energy intensity excited at the dividing region is eliminated or mitigated by selecting the length of the adjacent electrode fingers 7 and 8 at the dividing region to be ¾L where L is the overlapping length of any other adjacent electrode fingers that are overlapped with each other. Let it be assumed that the overlapping length of the adjacent electrode fingers other than the dividing region, i.e. the adjacent electrode fingers in the divided electrode portions, is L. Further let it be assumed that the electrode pitch that contributes to excitation of the acoustic surface wave, i.e. the distance between the centers of the adjacent electrode fingers, is P. Further let it be assumed that a voltage V is applied between the adjacent electrode fingers. Then the acoustic surface wave energy excited between the ordinary adjacent electrode fingers, i.e. the adjacent electrode fingers other than those in the dividing region, may be expressed by the following equation.

$$e = m (L/P) V \qquad (1)$$

where m is a constant. Now consider the acoustic surface wave energy $e_0$ excited at the region between the electrode fingers 31 and 32 extending from the common comb shaped electrodes 3. Assuming that the acoustic surface wave energy excited between the adjacent electrode fingers 7 and 8 is $e_1$, and considering the fact that the voltage applied between the adjacent electrode fingers 7 and 8 is 2 V and the overlapping lengthes are ¾L, the energy $e_1$ may be expressed by the following equation.

$$e_1 = m \frac{\frac{3}{4}L}{P} 2V = \frac{3}{2} m \frac{L}{P} V \qquad (2)$$

Further let it be assumed that the acoustic surface wave energy excited between the electrode fingers 7 and 31 is $e_2$ and the acoustic surface wave energy excited between the electrode fingers 8 and 32 is $e_3$. Then the energy $e_2$ and $e_3$ may be expressed by the following equation.

$$e_2 = e_3 = (\tfrac{3}{4} m (L/P) V \qquad (3)$$

Accordingly, the acoustic surface wave energy $e_0$ excited at the dividing region, i.e. between the electrode fingers 31 and 32, may be expressed by the following equation.

$$e_0 = e_1 + e_2 + e_3 = 3m (L/P) V = 3e \qquad (4)$$

Thus, it would be appreciated that the total acoustic surface wave energy $e_0$ in the dividing region, i.e. the region between the electrode fingers 31 and 32, is three times that between any other adjacent electrode fingers. As a result, the acoustic surface wave energy intensity developed throughout the interdigital transducer 100 is substantially continuous and the discontinuity occurring at the dividing region of the conventional divided electrode type acoustic surface wave device is eliminated, with the result that the freedom of design is much enhanced.

Figure 7:
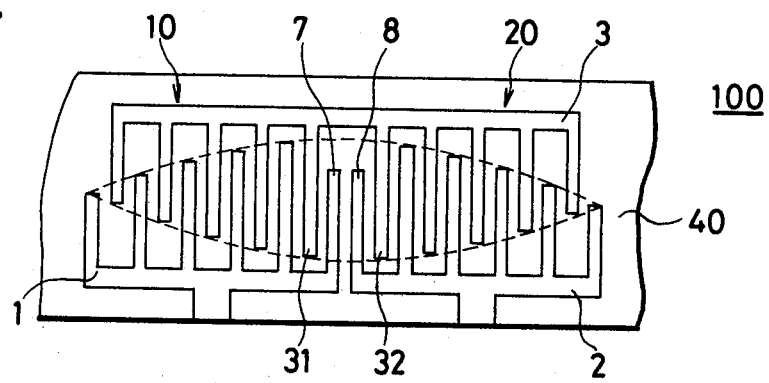
FIG. 7 shows an electrode pattern of the interdigital electrode of another embodiment of the present invention.

FIG. 7 shows an electrode pattern of the interdigital electrode of another embodiment of the present invention. The embodiment shown is an example wherein the present invention is embodied in an acoustic surface wave device including the interdigital electrode having weighted overlapping lengths of the adjacent electrode fingers determined in association with a desired impulse response, as taught in the above referenced U.S. Pat. No. 3,699,364. Referring to FIG. 7, the dotted line shows an envelope for connecting the free ends of the respective electrode finger. The curve of the envelope is determined based on a desired frequency characteristic of the acoustic surface wave device. The adverse affect by the dividing region in an electrode divided type acoustic surface wave device is aggravated particularly in case of a weighted overlapping length type. Therefore, the adjacent electrode fingers 7 and 8 are preferably selected to be shorter than the original length thereof, i.e. the overlapping lengths of the adjacent electrode fingers closest to the dividing region or the width of the envelope at the dividing region, preferably as short as approximately ¾ of the original length. As a result, the above described equations (1) to (4) are substantially applicable and the resultant effect is also substantially the same as the embodiment described previously.

Although in the embodiments shown in FIGS. 6A and 7 both the adjacent electrode fingers 7 and 8 in the dividing region were selected to be shorter to the same extent, alternatively one of them may be selected to be longer and the other of them may be selected to be shorter than the above discussed same shortened lengths while the total acoustic surface energy in the dividing region is adapted to be the same as that in the region other than the dividing region.

Figure 8A:
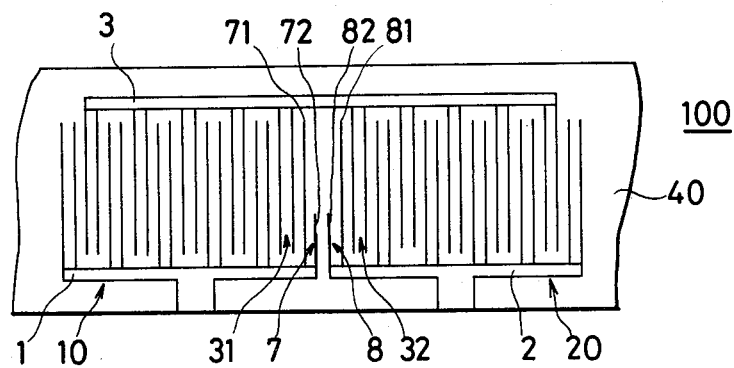
FIG. 8A shows an electrode pattern of the interdigital electrode of a further embodiment of the present invention.
Figure 8B:
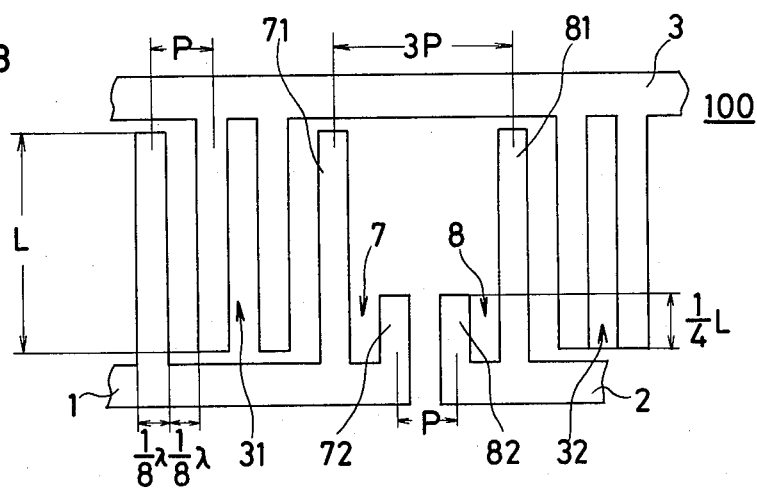
FIG. 8B shows an enlarged view of the electrode pattern in the dividing region of the FIG. 8A embodiment.

FIG. 8A shows an electrode pattern of the interdigital electrode of still a further embodiment of the present invention. The embodiment shown comprises an improvement in the FIG. 5 device and the electrode fingers of the respective comb shaped electrodes 1, 2 and 3 are formed in a so-called split electrode type as taught in the above referenced U.S. Pat. No. 3,727,155, while the envelope of the interdigital electrodes is of an ordinary or non-weighted type. FIG. 8B shows an enlarged view of the dividing portion of the FIG. 8A embodiment. As best seen in FIG. 8B, the width of the electrode elements constituting each split type electrode finger has the width of ⅛λ and the spacing between the adjacent electrode elements is also selected to be ⅛λ. In the dividing region the electrode finger 7 of the comb shaped electrode 1 and the electrode finger 8 of the comb shaped electrode 2 are adjacent to each other. The electrode finger 7 is implemented by two electrode elements 71 and 72 and the electrode finger 8 is implemented by two electrode elements 81 and 82. In the embodiment shown, only the adjacent electrode elements 72 and 82 are selected to be shorter than the remaining electrode fingers to the same extent. In the embodiment shown, the adjacent electrode elements 72 and 82 are selected to be as short as a quarter or one fourth of the overlapping lengths of the remaining adjacent electrode fingers. In other words, the lengths of only the adjacent electrode elements 72 and 82 are selected to be about ¼L, assuming that the overlapping lengths of the adjacent electrode fingers in the region other than the dividing region is L. The above discussed shortened lengths of the adjacent electrode elements 72 and 82 may be changed larger or smaller in consideration of the configuration of the electrode portion for commonly connecting the fingers and a weighting function, if employed, of the electrode fingrers, as described previously.

Now description will be made of how the discontinuity of the acoustic surface wave energy in the dividing region can be eliminated or mitigated in the embodiment shown in FIGS. 8A and 8B. In the region other than the region between the two opposing electrode fingers 7 and 8 implemented also in a split type of the intermediate potential comb shaped electrode 3, the acoustic surface wave energy e excited between any adjacent electrode fingers may be expressed by the above described equation (1). Now the acoustic surface energy $e_{01}$ excited between the electrode fingers 7 and 8 will be considered. Assuming that the acoustic surface wave energy excited between the electrode element 72 of the electrode finger 7 and the electrode element 82 of the electrode finger 8 is $e_{11}$, and considering the fact that the voltage applied between the two electrode elements 72 and 82 is 2V, then the energy $e_{11}$ may be expressed by the following equation.

$$e_{11} = m \frac{\frac{1}{4}L}{P} 2V = \frac{1}{2} m \frac{L}{P} V \quad (5)$$

Similarly, the acoustic surface wave energy $e_{21}$ excited between the electrode elements 71 and 81 may be expressed by the following equation.

$$e_{21} = m \frac{\frac{3}{4}L}{3P} 2V = \frac{1}{2} m \frac{L}{P} V \quad (6)$$

Therefore, the energy $e_{01}$ excited at the dividing region may be expressed by the following equation.

$$e_{01} = e_{11} + e_{21} = \frac{1}{2} m \frac{L}{P} V + \frac{1}{2} m \frac{L}{P} V = m \frac{L}{P} V = e \quad (7)$$

Thus, the acoustic surface wave energy $e_{01}$ excited at the dividing region, i.e. between the electrode fingers 7 and 8 is the same as the energy e excited in the region other than the dividing region. As a result, the acoustic surface wave energy intensity in the interdigital transducer 100 is continuous and the division of the interdigital electrode makes no discontinuity of the energy.

Figure 9:
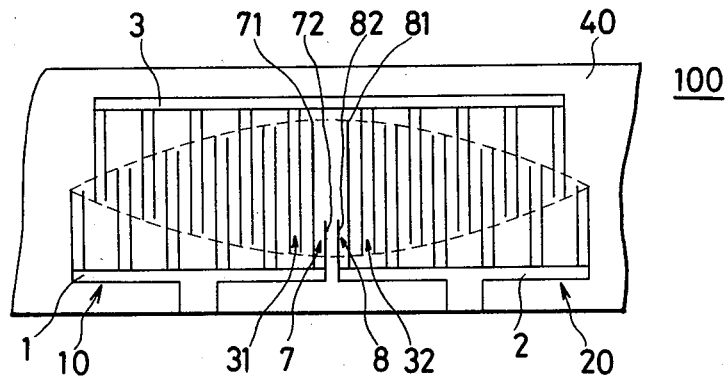
FIG. 9 shows an electrode pattern of the interdigital electrode of still a further embodiment of the present invention.

FIG. 9 shows an electrode pattern of the interdigital electrode of still another embodiment of the present invention. The embodiment shown in FIG. 9 is similar to the FIG. 7 embodiment but comprises the electrode fingers implemented in a split electrode type. In the same manner as described with reference to FIGS. 8A and 8B, the electrode elements 72 and 82 of the adjacent electrode fingers 7 and 8 in the dividing region are selected to be shorter than the width of the envelope in the dividing region, to be as short as approximately a quarter of the width of the envelope at the dividing region. This provides for a continuous distribution of the acoustic surface wave energy intensity as discussed previously. It is pointed out that this effect is particularly conspicuous in case of an acoustic surface wave device including the interdigital electrode of the weighted overlapping lengths.

In the embodiments shown in FIGS. 8A, 8B and 9, the adjacent electrode elements 72 and 82 of the adjacent electrode fingers 7 and 8 at the dividing region were selected to be shorter than the original lengths to substantially the same extent. However, just in the same manner as described with reference to the embodiment employing the electrode fingers of a solid type, one of them may be longer and the other of them may be shorter than the above discussed same shortened lengths insofar as the total acoustic surface wave energy in the dividing region becomes the same as the acoustic surface wave energy in the region other than the dividing region. Further embodiments implemented by way of an extremity of such modification will be described with reference to FIGS. 10A, 10B and 11.

Figure 10A:
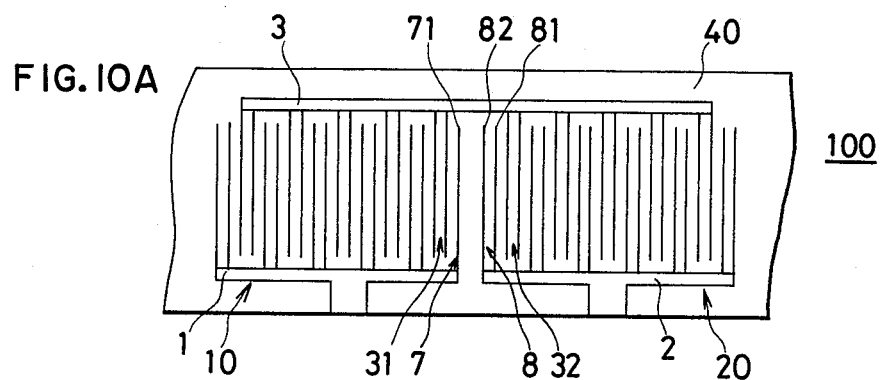
FIG. 10A shows an electrode pattern of the interdigital electrode of still another embodiment of the present invention.
Figure 10B:
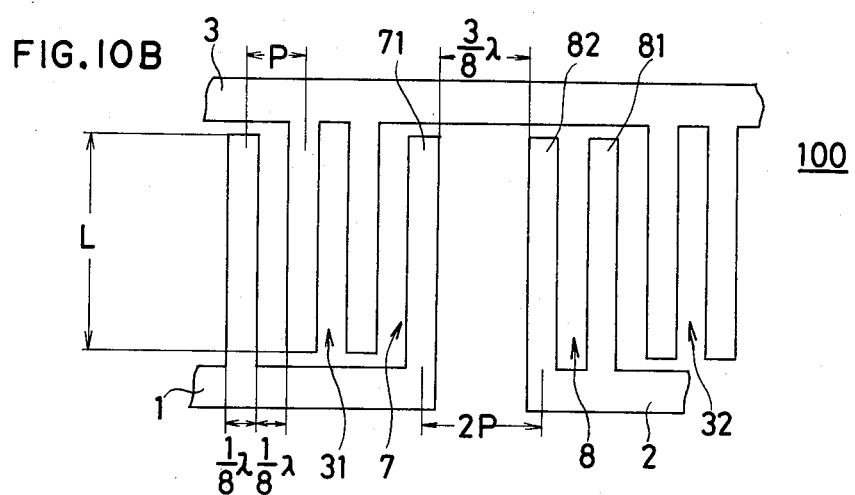
FIG. 10B shows an enlarged view of the electrode pattern in the dividing region of the FIG. 10A embodiment.

FIG. 10A shows an electrode pattern of the interdigital electrode of still a further embodiment of the present invention. The embodiment shown comprises the electrode fingers implemented in a split type, with the electrode fingers 7 and 8 adjacent to each other at the dividing region. In the embodiment shown, the electrode element (the electrode element corresponding to the electrode element 72 in case of the embodiment shown in FIGS. 8A and 8B) of one electrode finger (the electrode finger 7 in the embodiment shown) out of the adjacent electrode fingers that is adjacent to the other electrode finger (the electrode finger 8 in the embodiment shown) is totally removed. On the other hand, the finger element 82 of the electrode finger 8 is left as long as the same length of the overlapping lengths of any other adjacent electrode fingers. An enlarged view of the dividing portion of the FIG. 10A embodiment is shown in FIG. 10B. As seen from the enlarged view in FIG. 10B, the width of the respective electrode elements of the electrode fingers is selected to be $\frac{1}{8}\lambda$ and the spacing between the adjacent electrode elements is also selected to be $\frac{1}{8}\lambda$. However, only the spacing between the adjacent electrode elements 71 and 82 at the dividing region is selected to be $\frac{3}{8}\lambda$.

Now description will be made of the reason why the discontinuity of the acoustic surface wave energy intensity is eliminated by the embodiment shown in FIGS. 10A and 10B. The acoustic surface wave energy e excited between any adjacent electrode fingers in the ordinary region other than the dividing region between the electrode fingers 7 and 8 may be expressed by the above described equation (1). On the other hand, taking into consideration the fact that the electrode pitch between the electrode elements 71 and 82 is as large as two times the ordinary pitch and the voltage applied between the electrode finger elements 71 and 82 is 2V, then the acoustic surface wave energy $e_{02}$ excited at the dividing region between the electrode fingers 7 and 8 may be expressed by the following equation.

$$e_{02} = m(L/2P)2V = m(L/P)V = e \qquad (8)$$

Therefore, the acoustic surface wave energy $e_{02}$ excited between the electrode fingers 7 and 8 becomes the same as the acoustic surface wave energy e excited between any adjacent electrode fingers in the region other than the above described dividing region. As a result, the acoustic surface wave energy intensity throughout the interdigital transducer becomes continuous and the discontinuity of the acoustic surface wave energy intensity caused by division of the interdigital electrode is eliminated.

Figure 11:
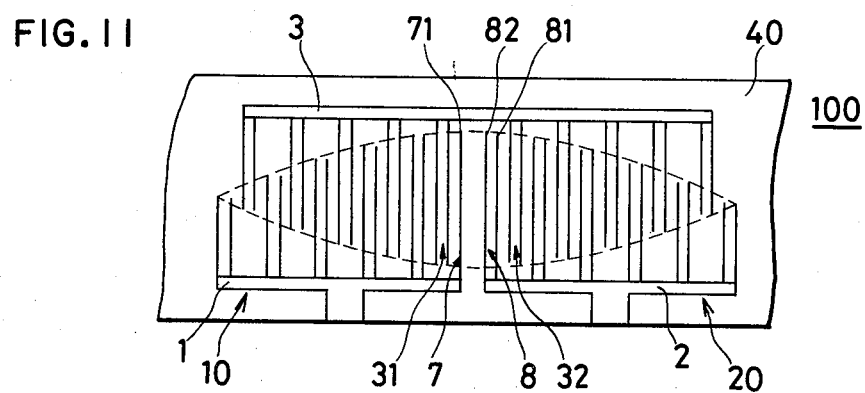
FIG. 11 shows an electrode pattern of the interdigital electrode of still a further embodiment of the present invention.

FIG. 11 shows an electrode pattern of the interdigital electrode of still another embodiment of the present invention. In comparison of the FIG. 11 embodiment with the FIG. 10A embodiment, the interdigital electrode of the FIG. 11 embodiment have been weighted in consideration of a desired frequency characteristic. Also in the embodiment shown in FIG. 11, one electrode element of the electrode finger 7 close to the electrode finger 8 has been totally removed, while one electrode element of the electrode finger 8 close to the electrode finger 7 has been left in full length. For the same reason as described in conjunction with the embodiment shown in FIGS. 10A and 10B, continuity of the acoustic surface wave energy intensity can be achieved in spite of division of the interdigital electrode.

Although in the foregoing description only one interdigital transducer was described as formed on a piezoelectric material substrate, another interdigital transducer is formed to be opposed to each other on the same piezoelectric material substrate, in order to provide a filter, delay line or the like by employing the inventive acoustic surface wave device.

In the foregoing the embodiments were described as embodied in such a manner that the interdigital electrode is divided into only two divided electrode portions. However, the present invention can be equally applicable to the embodiments wherein the interdigital electrode is divided into three or more divided electrode portions and the divided electrode portions are connected in a series fashion. Although in the foregoing the embodiments were described as employing the electrode fingers as equispaced, the present invention can also be applicable in such an acoustic surface wave device employing the interdigital electrode of electrode fingers of a variable pitch that is disclosed in U.S. Pat. No. 3,699,364, issued Oct. 17, 1972 to Henry M. Gerard an entitled "ACOUSTIC SURFACE WAVE DEVICE HAVING IMPROVED TRANSDUCER STRUCTURE".

Thus, according to the present inventon, the discontinuity of the acoustic surface wave energy in the dividing region encountered in a divided electrode type acoustic surface wave device can be eliminated or mitigated and therefore the freedom of designing an acoustic surface wave device such as a filter, delay line and the like is enhanced, while a desired frequency characteristic can be achieved with ease.

Although the present invention has been described and illustrated in detail, it is to be clearly undrstood that the same is by way of limitation, the spirit and scope of the present invention being limited only by the terms of the appended claims.

What is claimed is:

1. An acoustic surface wave device, comprising:
   a piezoelectric material substrate adapted for supporting propagating acoustic surface wave energy;
   at least one electromechanical transducer means for converting an electrical signal into an acoustical wave and vice versa, said transducer means being coupled to a surface of said piezoelectric material substrate at a transducer region thereof, said transducer means including an interdigital electrode assembly including first and second electrode portions, each of said electrode portions including,
   first and second common electrodes, and
   first and second groups of electrode fingers commonly connected respectively to said common electrodes at one end thereof and extending toward the other said common electrode to form overlapping electrode lengths which define an envelope, each of said electrode fingers being of the split type having two adjacent parallel split electrode elements;

said first and second electrode portions being positioned adjacent to each other at an electrode dividing region of said substrate so that said electrode fingers of said first and second electrode portions are parallel to each other and said common electrodes of said first and second electrode portions are substantially colinear;

said first and second electrode portions being electrically connected in series by connecting a common electrode of said first electrode portion with a common electrode of said second electrode portion;

the split electrode element of at least one of said first and second electrode portions directly adjacent to said electrode dividing region forming an end electrode element of a length less than the length of the other adjacent electrode fingers of said first and second electrode portions which form said envelope.

2. An acoustic surface wave device in accordance with claim 1, wherein said end electrode elements of said first and second interdigital electrode portions are selected to be substantially the same length.

3. An acoustic surface wave device in accordance with claim 2, wherein said end electrode elements of said first and second interdigital electrode portions are selected to be approximately one quarter of the length of said other adjacent electrode fingers which form said envelope.

4. An acoustic surface wave device in accordance with claim 1 wherein said end electrode element of said first interdigital electrode portion is longer than said end electrode element of said second interdigital electrode portion.

5. An acoustic surface wave device in accordance with claim 4, wherein said end electrode element of said first interdigital electrode portion is selected to be substantially the same length as said other adjacent fingers which form said envelope, and
wherein said electrode finger of said second interdigital electrode portion adjacent said electrode dividing region includes only one electrode element.

6. An acoustic surface wave device in accordance with claim 1, wherein said envelope is determined by a predetermined weighting function, whereby the lengths of said electrode fingers are determined as a function of said weighting function.

7. An acoustic surface wave device in accordance with claim 1, wherein the spacing between the centers of adjacent electrode fingers is changed in the propagating direction of the acoustic surface wave energy.

8. An acoustic surface wave device in accordance with claim 1, wherein the split electrode elements of said interdigitated electrode assembly not directly adjacent to said electrode dividing region are all of the same length and define a rectangular envelope.

9. An acoustic surface wave device, comprising:
a piezoelectric material substrate adapted for supporting propagating acoustic surface wave energy;
at least one electromechanical transducer means for converting an electrical signal into an acoustical wave and vice versa, said transducer means being coupled to a surface of said piezoelectric material substrate at a transducer region thereof, said transducer means including an interdigital electrode assembly including first and second electrode portions, each of said electrode portions including,
first and second common electrodes, and
first and second groups of electrode fingers commonly connected respectively to said common electrodes at one end thereof and extending toward the other said common electrode to form overlapping electrode lengths which define an envelope, each of said electrode fingers being of the split type having two adjacent parallel split electrode elements;
said first and second electrode portions being positioned adjacent to each other at an electrode dividing region of said substrate so that said electrode fingers of said first and second electrode portions are parallel to each other and said common electrode so said first and second electrode portions are substantially colinear;
said first and second electrode portions being electrically connected in series by connecting a common electrode of said first electrode portion with a common electrode of said second electrode portion;
the electrode fingers of said first and second electrode portions directly adjacent to said electrode dividing region forming end electrode fingers, said end electrode finger of said first electrode portion having only one split electrode element.

10. An acoustic surface wave device in accordance with claim 9, wherein the split electrode elements of said interdigitated electrode assembly are all of the same length and define a rectangular envelope.

* * * * *